(12) United States Patent
Rachmady et al.

(10) Patent No.: US 9,929,273 B2
(45) Date of Patent: Mar. 27, 2018

(54) APPARATUS AND METHODS OF FORMING FIN STRUCTURES WITH ASYMMETRIC PROFILE

(71) Applicant: Intel Corporation, Santa Clara, CA (US)

(72) Inventors: Willy Rachmady, Beaverton, OR (US); Matthew V. Metz, Portland, OR (US); Chandra S. Mohapatra, Beaverton, OR (US); Gilbert Dewey, Hillsboro, OR (US); Nadia M. Rahhal-Orabi, Hillsboro, OR (US); Tahir Ghani, Portland, OR (US); Anand S. Murthy, Portland, OR (US); Jack T. Kavalieros, Portland, OR (US); Glenn A. Glass, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/528,763

(22) PCT Filed: Dec. 24, 2014

(86) PCT No.: PCT/US2014/072349
§ 371 (c)(1),
(2) Date: May 22, 2017

(87) PCT Pub. No.: WO2016/105412
PCT Pub. Date: Jun. 30, 2016

(65) Prior Publication Data
US 2018/0013000 A1    Jan. 11, 2018

(51) Int. Cl.
*H01L 29/78*    (2006.01)
*H01L 21/02*    (2006.01)
(Continued)

(52) U.S. Cl.
CPC .... *H01L 29/7853* (2013.01); *H01L 21/02532* (2013.01); *H01L 21/02694* (2013.01);
(Continued)

(58) Field of Classification Search
CPC ........... H01L 29/7853; H01L 21/30625; H01L 29/0653; H01L 21/76224; H01L 21/02694; H01L 21/02532; H01L 29/66795
See application file for complete search history.

(56) References Cited

U.S. PATENT DOCUMENTS

2010/0072515 A1    3/2010    Park et al.
2012/0104472 A1    5/2012    Xu et al.
(Continued)

FOREIGN PATENT DOCUMENTS

CN    107004713 A    8/2017
TW    201635548 A    10/2016
WO    2016/105412 A1    6/2016

OTHER PUBLICATIONS

International Preliminary Report on Patentability received for International Application No. PCT/US2014/072349, dated Jul. 6, 2017, 6 pages.
(Continued)

*Primary Examiner* — Selim Ahmed
(74) *Attorney, Agent, or Firm* — Green, Howard & Mughal LLP

(57) ABSTRACT

An embodiment includes a microelectronic device comprising: a substrate comprising a raised portion and a non-raised portion, wherein a dielectric material is disposed adjacent the raised portion, an epitaxial sub-fin structure disposed on the raised portion, wherein a bottom portion of the epitaxial sub-fin structure comprises an asymmetric profile, and an
(Continued)

epitaxial fin device structure disposed on the sub-fin structure. Other embodiments are described herein.

20 Claims, 11 Drawing Sheets

(51) Int. Cl.
    *H01L 29/66*     (2006.01)
    *H01L 21/762*     (2006.01)
    *H01L 29/06*     (2006.01)
    *H01L 21/306*     (2006.01)

(52) U.S. Cl.
    CPC .. *H01L 21/30625* (2013.01); *H01L 21/76224* (2013.01); *H01L 29/0653* (2013.01); *H01L 29/66795* (2013.01)

(56) References Cited

U.S. PATENT DOCUMENTS

| | | | |
|---|---|---|---|
| 2013/0089959 A1* | 4/2013 | Kwok | ................ H01L 29/045 438/283 |
| 2014/0264488 A1 | 9/2014 | Fronheiser et al. | |
| 2014/0284726 A1 | 9/2014 | Lee et al. | |

OTHER PUBLICATIONS

International Search Report and Written Opinion received for International Application No. PCT/US2014/072349, dated Sep. 18, 2015, 9 pages.

\* cited by examiner

APPARATUS AND METHODS OF FORMING FIN STRUCTURES WITH ASYMMETRIC PROFILE

BACKGROUND

Integration of epitaxial materials, such as indium aluminum phosphide, for example, onto substrates, such as silicon substrates, is highly desired in microelectronic device applications. High quality epitaxial materials enhance the performance for such applications as system on chip (SoC), high voltage and RF devices, as well as for complementary metal oxide silicon (CMOS) applications. This integration involves fabrication challenges that may arise due to the mismatch in lattice properties between the two materials.

BRIEF DESCRIPTION OF THE DRAWINGS

While the specification concludes with claims particularly pointing out and distinctly claiming certain embodiments, the advantages of these embodiments can be more readily ascertained from the following description of embodiments when read in conjunction with the accompanying drawings in which:

DETAILED DESCRIPTION

Figure 1A:
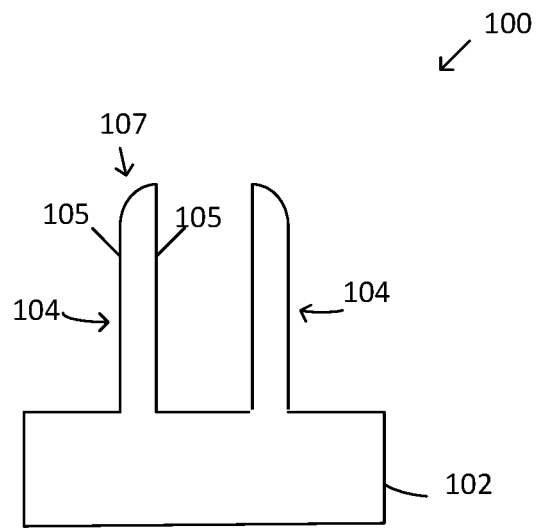
FIGS. 1a-1i represent cross-sectional views of structures according to various embodiments.

In the following detailed description, reference is made to the accompanying drawings that show, by way of illustration, specific embodiments in which the methods and structures may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed may be modified without departing from the spirit and scope of the embodiments. In the drawings, like numerals may refer to the same or similar functionality throughout the several views.

Various operations will be described as multiple discrete operations, in turn, in a manner that is most helpful in understanding the embodiments herein, however, the order of description should not be construed to imply that these operations are necessarily order dependent. In particular, these operations need not be performed in the order of presentation.

Implementations of the embodiments may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the embodiments herein.

Methods and associated structures of forming and utilizing microelectronic structures, such as epitaxial fin structures formed on substrates, are described. Those methods/structures may include forming an epitaxial sub-fin structure disposed on a raised portion of a substrate, wherein the raised portion comprises single sided (111) facet of the raised portion of the substrate. The (111) facet is disposed along the sub fin length. The asymmetry of the bottom portion of the sub fin limits epitaxial fin growth to a single growth front, thus reducing defects.

FIGS. 1a-1i illustrate cross-sectional views of embodiments of forming microelectronic structures, such as epitaxial fin structures disposed on a substrate, for example. In an embodiment, a microelectronic device 100 may comprise a substrate 102 (FIG. 1a). In an embodiment, the substrate 102 may comprise a silicon substrate, and may be p-doped with a p-type material/element such as boron, for example. In another embodiment, the substrate 102 may comprise circuit elements, such as transistors and passive elements, for example. In an embodiment, the substrate 102 may comprise a portion of a CMOS substrate 102, and may comprise p-type metal oxide semiconductor (PMOS) and n type metal oxide semiconductor (NMOS) transistors. In an embodiment, the microelectronic device 100 may comprise a portion of a tri-gate transistor, a gate all around (GAA) transistor, or any other type of multi-gate transistor. In an embodiment, the microelectronic device 100 may comprise a portion of a compound (including group III-V material) transistor.

A fin 104, which may comprise silicon in an embodiment, may be disposed on the substrate 102. In other embodiments, the fin may comprise any other type of suitable material, according to the particular application. In an embodiment, the fin 104 may be oriented such that it is orthogonally disposed on the substrate 102. In an embodiment, the fin 104 may comprise the same material as the substrate 102, and in other embodiments the fin 104 may comprise a different material than the substrate 102. In an embodiment, at least one fin 104 may be formed on the substrate 102, wherein the fins 104 may include opposing sidewalls 105 extending from a first surface 104 of the substrate 102 and which terminate in an upper surface 107. The upper surface 107 may comprise a curved profile in some embodiments, and may comprise other shapes, such as a more rectangular profile, in other embodiments. For the clarity and brevity, only two fins 104 are illustrated in FIG. 1a; however, it is understood that any appropriate number of fins 104 could be fabricated.

Figure 1B:
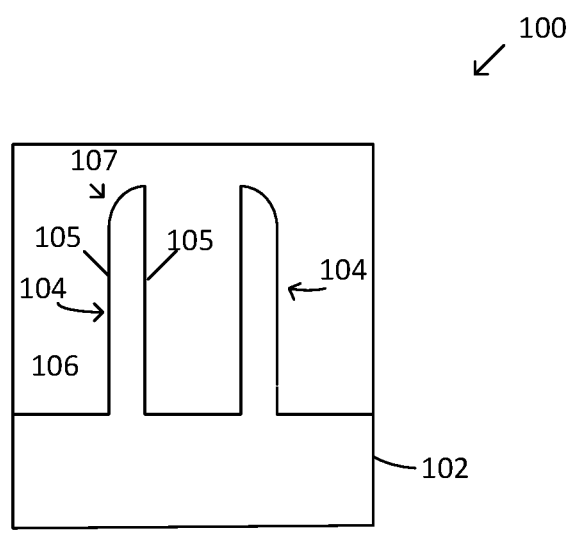

In an embodiment, an isolation material, such as a dielectric material 106, may be formed on the fin 104 (FIG. 1b). The dielectric material 106 may comprise a material such as silicon dioxide, and may comprise a shallow trench isolation (STI) material in some cases, wherein the dielectric material 106 abuts the opposing fin sidewalls 105. The dielectric material 106 may comprise such materials as carbon doped oxide (CDO), silicon nitride, silicon oxyntiride, silicon carbide, organic polymers such as perfluorocyclobutane or polytetrafluoroethylene, fluorosilicate glass (FSG), and/or ganosilicates such as silsesquioxane, siloxane, or organosilicate glass, in embodiments. In an embodiment, the dielectric material 106 may comprise multiple layers of different materials. The dielectric material 106 may comprise a chemical vapor deposition (CVD) deposited material in an embodiment.

Figure 1C:
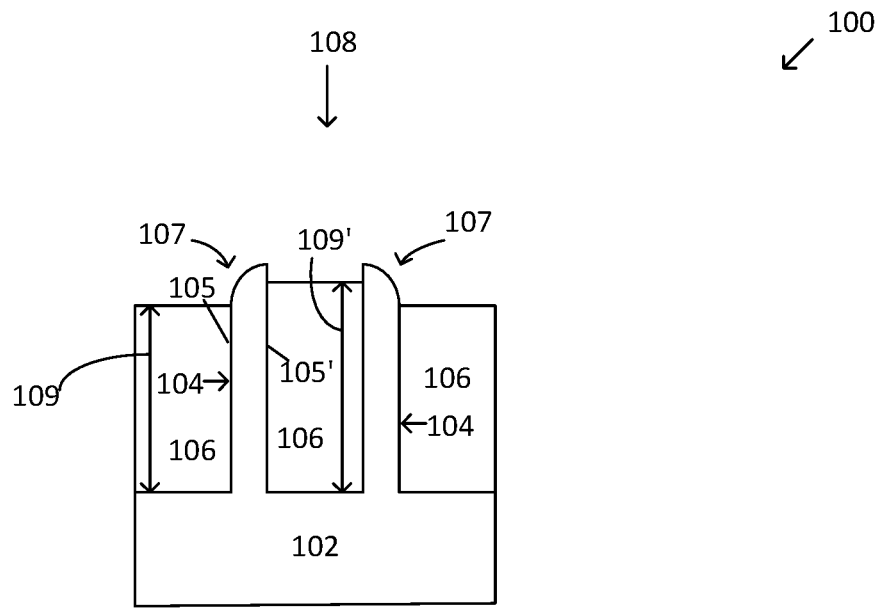

In an embodiment, a portion of the isolation material 106 may be removed by utilizing a removal process 108, such as a chemical mechanical polishing (CMP) process 108 (FIG. 1c). In an embodiment, a portion of the dielectric material 106 may be removed by a utilizing an oxide polish removal process. In other embodiments, other removal processes may be utilized, such as various wet and/or dry etching processes for example. The top portion 107 of the fin 104 may be exposed subsequent to the removal process 108, in an embodiment. Due to the fin profile 107, an asymmetric oxide topography may result after the oxide removal process 108, wherein a height 109 of the dielectric material 106 adjacent a first sidewall 105 of the fin 104 is at a shorter height than a height 109' of a second sidewall 105' of the fin 104.

Figure 1D:
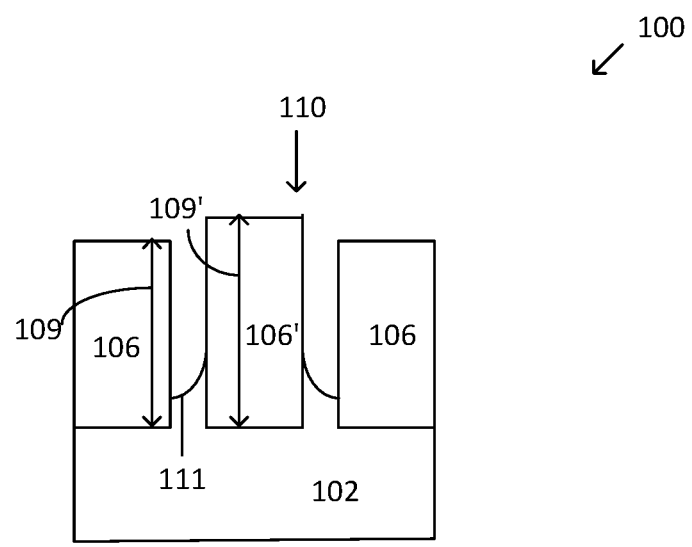

In an embodiment, an isotropic etch process 110 may be performed, wherein a portion of the fin 104 may be removed (FIG. 1d). Because the etch process 110 is isotropic, in an embodiment, no particular crystallographic planes (facets) of the material of the fin 104 are preferred/exposed during the isotropic etch process 110, and the profile of the isotropic remaining fin portion 111 after the isotropic etch process 110 is performed, comprises a curved profile. In an embodiment, the isotropic etch process may comprise a silicon etch, and may comprise such proceses as a plasma dry etch process using chlorine or SF6 plasma chemistry, or a wet etchant may be employed such as a nitric acid/HF solution. In an embodiment, adjacent dielectric material regions 106, 106' that are in contact with the isotropic remaining fin portion 111, remain asymmetric in topography, that is, a height 109 of the first dielectric material 106 is shorter than a height 109' of an adjacent dielectric material region 106'.

Figure 1E:
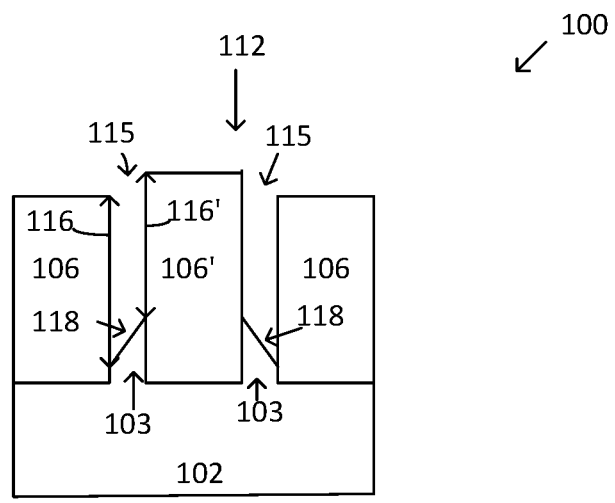

In an embodiment, an asymmetric removal process 112 may be performed, wherein (111) facets of the remaining fin portion 103 may be exposed (FIG. 1e). In an embodiment, a wet etch, such as a tetramethylammonium hydroxide (TMAH) etchant and/or an etchant comprising ammonium hydroxide, for example, may be utilized to remove a portion of the fin structure 104, however other dry and/or wet etches may be utilized according to the particular application. The asymmetric remaining fin portion 103 may comprise a slanted, asymmetric profile, and may comprise a single-sided dominant (111) facet that is exposed. In an embodiment, the asymmetric remaining fin portion 103 comprises a raised portion 103 of the substrate 102, wherein a top surface 118 of the raised portion comprises a single sided (111) facet of the fin 104 material. In an embodiment, the single sided (111) facet of the top surface 118 may comprise a single sided silicon (111) facet. In an embodiment, the single sided (111) facet of the top surface 118 may be disposed along a fin device structure length, in a channel current direction, to be described in more detail herein. In an embodiment, the raised portion is adjacent a portion of the dielectric material 106.

In an embodiment, an opening 115 may be formed by the removal of a portion of the fin 104 structure. In an embodiment, the dielectric 106, 106' sidewalls of the opening 115 may comprise unequal heights 116, 116'. In an embodiment, the bottom of the opening/trench 115 comprises the top surface 118 of the raised portion 103 of the substrate 102, and comprises the single sided (111) facet. In an embodiment, the trench opening 115 may comprise an aspect ratio trapping (ART) trench 115, wherein a ratio of a depth of the trench opening to a width of the trench 115 opening may comprise at least about 2:1. In other embodiments, the ratio may comprise 1.5, 1.7, 1.9, 2.1, 2.3, 2.5, 2.7, for example.

Figure 1F:
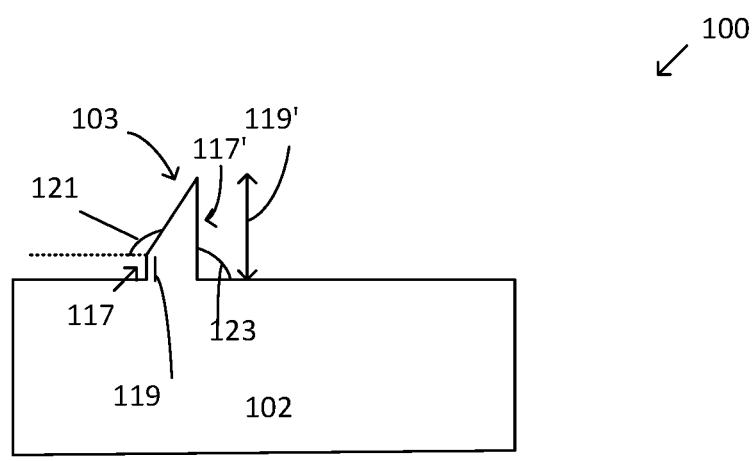

In an embodiment, the raised portion 103 of the substrate 102 may comprise a first side 117 and a second side 117'. (See FIG. 1f, depicting the raised portion 103 of the substrate 102 for clarity). In an embodiment, the first and second sides 117, 117' may comprise different heights, 119, 119', wherein the first height 119 may be shorter than the second height 119'. In other embodiment, the first and second heights 119, 119' may comprise substantially similar heights. In an embodiment, the raised substrate 103 may comprise a first angle 121 with respect to the substrate 102 and a second angle 123 with respect to the substrate 102, wherein the first angle 121 may comprise about 120 degrees to about 130 degrees, and the second angle 123 may comprise about 85 degrees to about 95 degrees, in some embodiments.

Figure 1G:
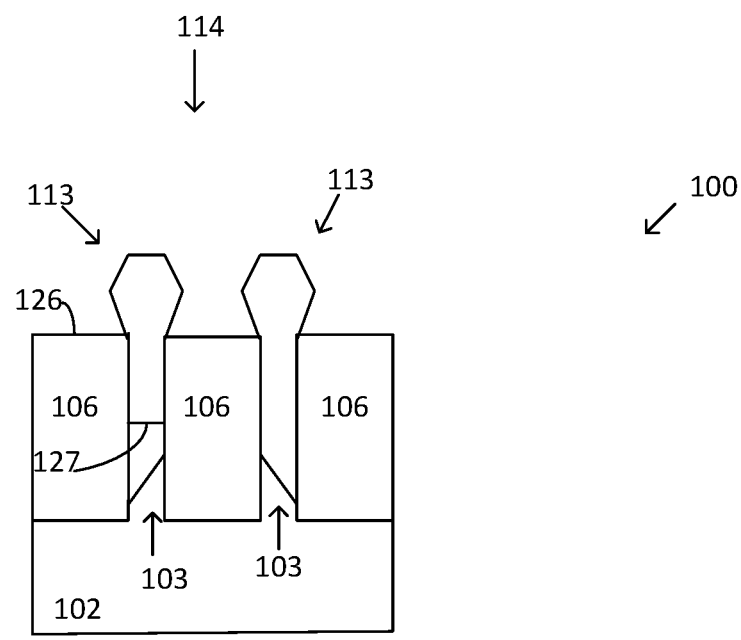

In an embodiment, the dielectric material 106 may be planarized (not shown) and an epitaxial material 113 may be formed in the opening 115 (FIG. 1g). In an embodiment, the epitaxial material 113 may comprise a III-V epitaxial material 113, and may be formed utilizing any suitable epitaxial process 114, within the trench opening 115. In an embodiment, the epitaxial material 113 may comprise any material comprising elements from group III, IV, and/or V of the periodic table, and combinations thereof. In an embodiment, the epitaxial material 113 may be grown utilizing any suitable epitaxial process, and may comprise a width 127 between about 4 nm and about 80 nm, in some embodiments.

In an embodiment, the epitaxial material 113 may comprise a III-V material, such as at least one of a gallium nitride, indium gallium nitride, indium phosphide, indium aluminum phosphide, gallium arsenide, indium aluminum phosphide, indium gallium arsenide, gallium arsenide, indium arsenide and indium gallium nitride, germanium, and silicon germanium, and combinations thereof. In an embodiment, the epitaxial material 113 may comprise multiple layers of epitaxial material that may be formed upon one another, which may comprise a stack of multiple, heterogeneous epitaxial layers, in which the lattice constants of the various layers may be different from one another. In an embodiment, the epitaxial material 113 may comprise multiple layers of lattice mismatched epitaxial materials. In an embodiment, the epitaxial material 113 may commence growing on the (111) surface of the asymmetric raised portion 103 of the substrate 102. In an embodiment, the epitaxial material 113 may be grown from a single growth front, since the raised portion 103 comprises a single sided (111) facet of the fin material. Growth from a single growth front is advantageous because by avoiding multiple growth fronts (such as what may occur when utilizing a V shape at the bottom of the trench opening, as in some prior art structures), defect formation is greatly reduced.

Figure 1H:
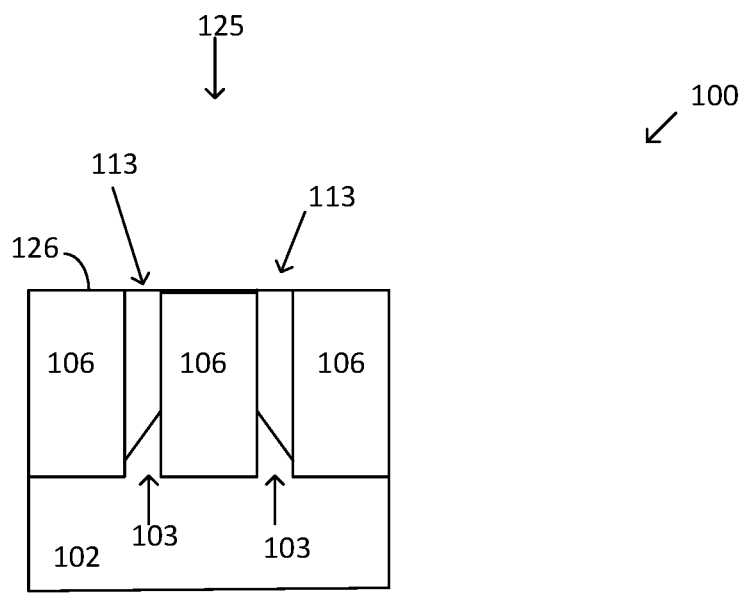

In an embodiment, an additional portion of the epitaxial material 113 disposed above the surface 126 of the isolation material 106 may be removed utilizing a removal process 125, such as a CMP process, for example, to become planarized with the surface 126 of the isolation/dielectric material 106 (FIG. 1h).

Figure 1I:
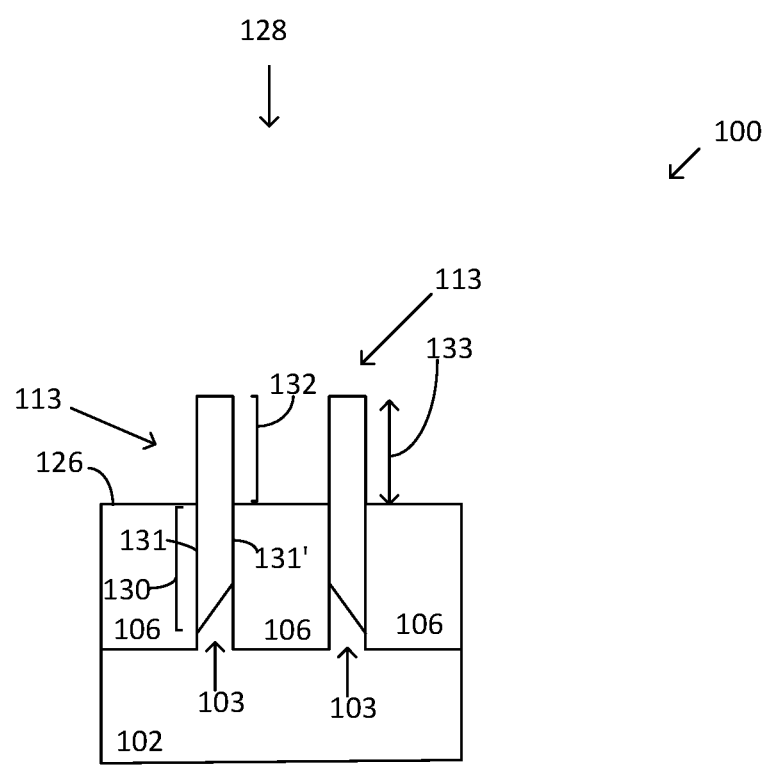

In an embodiment, a portion of the dielectric material 106 may be recessed utilizing a removal process 128, such as a CMP process, wherein an exposed portion of the epitaxial material 113 forms/comprises at least one fin device structure 132. (FIG. 1i). In an embodiment, the fin device structure 132 may extend above the surface 126 of the dielectric material 106, and may comprise a height 133. In an embodiment, the fin device structure 132 height 125 may comprise between about 4 nm to about 80 nm. A portion of the fin device structure 132 may comprise a portion of a multi-gate device, such as a channel region of a multi-gate device, for example, and may be coupled with source/drain regions during subsequent processing, in an embodiment.

In an embodiment, the epitaxial material 113 comprises a first portion 130 disposed within a portion of the dielectric material 106, wherein the first portion 130 is disposed on the raised portion 103 of the substrate 102. The first portion 130 may comprise a sub-fin portion 130. In an embodiment, the sub-fin 130 may comprise sidewalls 131, 131' of unequal height. In an embodiment, sub-fin 131 may be longer than sub-fin 131'. In an embodiment, a bottom portion of the sub-fin structure 130 may comprise an asymmetrical profile, wherein the bottom portion (disposed directly on the raised portion 103 of the substrate 102) of the sub-fin 130 is slanted due to the unequal heights of the sidewalls 131, 131' of the sub-fin 130. In an embodiment, a ratio of a length of the sub-fin 130 to a width of the sub fin 130 may comprise at least about 2:1. The fin device structure 132 may comprise a second portion 132 of the epitaxial material 113. In an embodiment, the fin device structure 132 is disposed directly on the sub-fin structure 130, wherein the sub-fin structure is disposed below the surface 126 of the isolation material 106.

In an embodiment, a plurality of transistors, such as metal-oxide-semiconductor field-effect transistors (MOSFET or simply MOS transistors), may be fabricated on the substrate 102, and may in general comprise the epitaxial material 113, and may include the fin device structure 132. In various implementations of the embodiments, the MOS transistors may be planar transistors, nonplanar transistors, or a combination of both. Nonplanar transistors include FinFET transistors such as double-gate transistors and tri-gate transistors, and wrap-around or gate all around (GAA) transistors such as nanoribbon and nanowire transistors. The embodiments herein may be carried out using nonplanar and/or planar transistors.

Each MOS transistor comprising the epitaxial material/fin device structure may include a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the embodiment, the gate electrode may consist of a combination of U-shaped structures and planar, non-U-shaped structures. For example, the gate electrode may consist of one or more U-shaped metal layers formed atop one or more planar, non-U-shaped layers.

In some implementations of the embodiments, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions.

An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 2A:
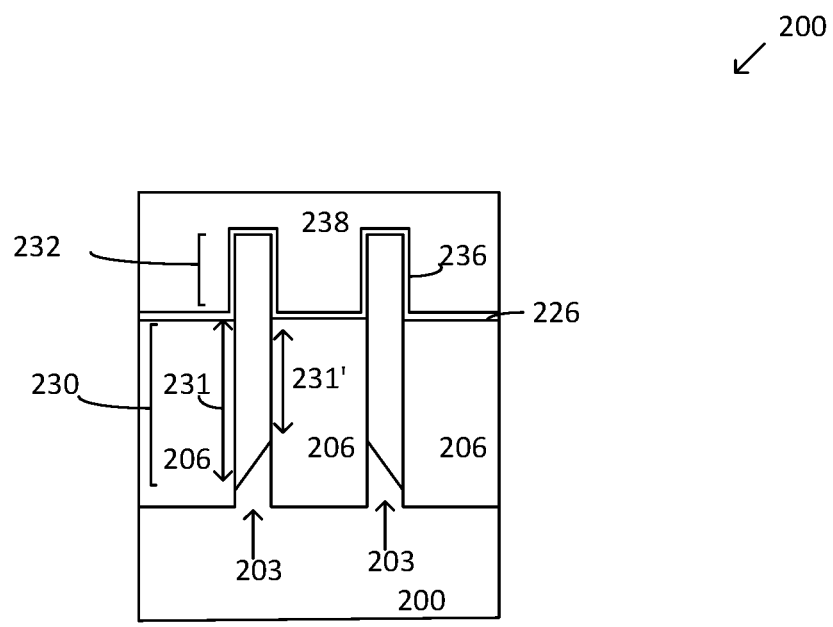
FIGS. 2a-2c represents cross-sectional views of structures according to embodiments.

FIG. 2a depicts a cross section of a portion of microelectronic device 200, such as a tri-gate or other type of multi-gate device 200, that may include the device structures of the embodiments herein. In an embodiment, an epitaxial material 213 comprises a first portion 230, which may comprise a sub-fin 230, disposed on a raised portion 203 (similar to the raised portion of FIG. 1f, for example) of the substrate 202. In an embodiment, the first portion 230 comprises sidewalls 231, 231' that are of unequal heights. The raised portion 203 comprises a single-sided (111) facet that extends along the length of a second portion 232 of the epitaxial material 213, wherein the second portion 232 may comprise a fin device structure 232. In an embodiment, a portion of the fin device structure 232 may comprise a portion of a channel region of a multi-gate device, wherein the single sided (111) facet may be disposed along the direction of the channel current.

A gate oxide 236 may be disposed on the fin device structure 232 and on a surface 226 of the isolation material 206. The gate oxide 236 may comprise an oxide material, such as a silicon dioxide material. In an embodiment, the gate oxide material may comprise a high k dielectric material, wherein the dielectric material comprises a dielectric constant greater than that of silicon dioxide.

High-k dielectric materials may include hafnium dioxide ($HfO_2$), hafnium silicon oxide, lanthanum oxide, lanthanum aluminum oxide, zirconium dioxide ($ZrO_2$), zirconium silicon oxide, titanium dioxide ($TiO_2$), tantalum pentaoxide ($Ta_2O_5$), barium strontium titanium oxide, barium titanium oxide, strontium titanium oxide, yttrium oxide, aluminum oxide, lead scandium tantalum oxide, and lead zinc niobate, for example.

In an embodiment, a gate material 238 may be disposed on the gate oxide 236. In an embodiment, gate materials include, for example, materials such as titanium, tungsten, tantalum, aluminum, and alloys thereof, and alloys with rare earth elements, such as erbium, dysprosium or noble metals such as platinum, and nitrides such as tantalum nitride and titanium nitride. In an embodiment, the fin device structure 232 may comprise a portion of a channel region with the gate oxide 236 and the gate material 238 disposed thereon.

Figure 2B:
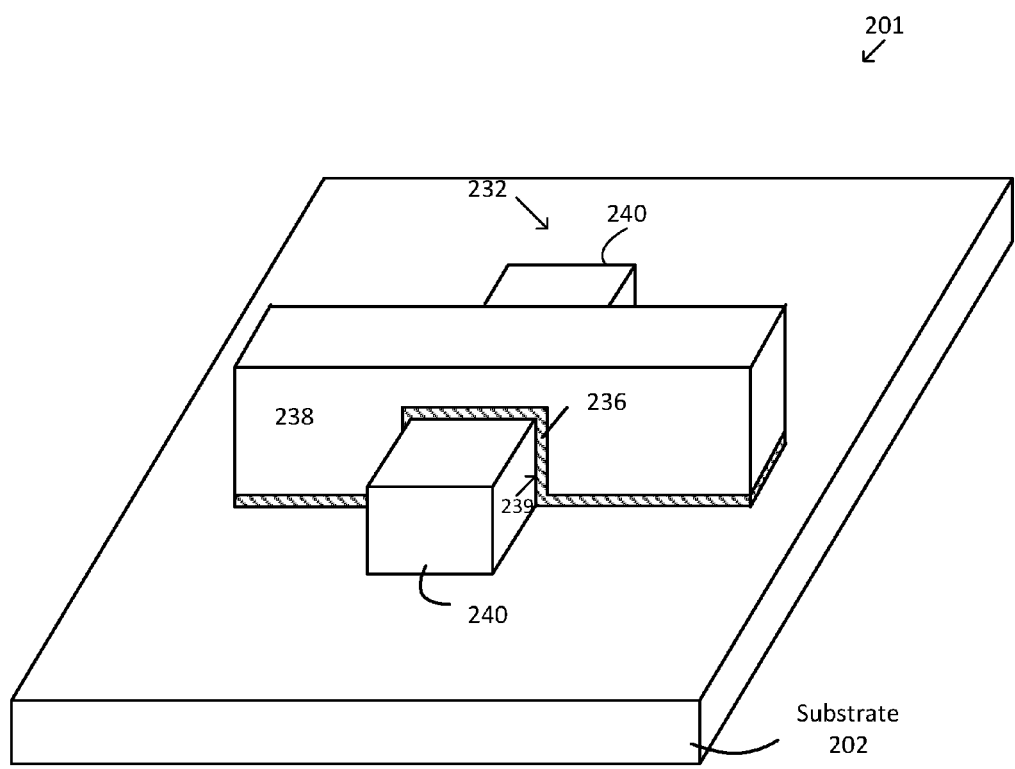

FIG. 2b depicts a portion of a multi-gate transistor 200 wherein source/drain regions 240 are coupled with a channel region 239 of the fin device structure 232. In an embodiment, materials for sources and/or drains may include, for example, silicon, carbon doped silicon, and phosphorus doped silicon, for NMOS, and boron doped silicon germanium, $Si_XGe_{1-X}$, boron doped germanium, boron doped germanium tin, $Ge_XSn_{1-X}$, and p-doped III-V compounds for PMOS applications. In an embodiment, a gate oxide 236 is disposed on the channel region 239 of the fin device structure 232, and a gate material 238 is disposed on the gate oxide 236. The single sided (111) facet of the raised portion of the substrate 203 (not shown) is disposed along the channel 239 direction.

Figure 2C:
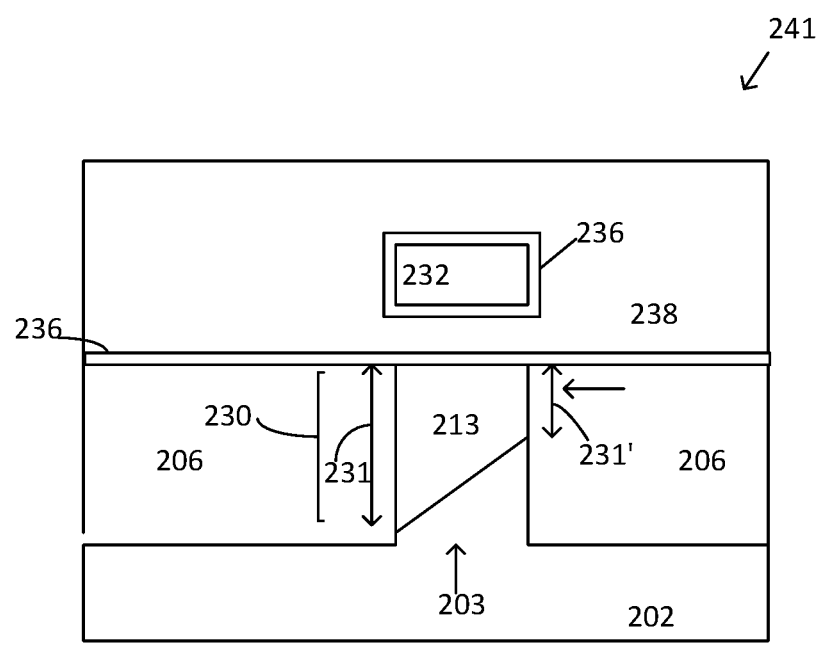

FIG. 2c depicts a gate all around structure 241, which may comprise a nanoribbon and/or a nanowire structure, for example. A gate oxide 236 may be disposed all around (on all sides) the fin device structure 232, and on the isolation material 206. A first portion of the epitaxial material 213 may be disposed beneath the fin device structure 232, and may be disposed on the substrate 202 and adjacent the isolation material 206. In an embodiment, the first portion 230, which may comprise a sub-fin portion 230, comprises sidewalls 231, 231' that are of unequal heights. A raised portion 203 of the substrate 202 comprises a single-sided (111) facet that extends along a length of the fin device structure 232. In an embodiment, a portion of the fin device structure 232 may comprise a portion of a channel region of a multi-gate device.

Figure 3:
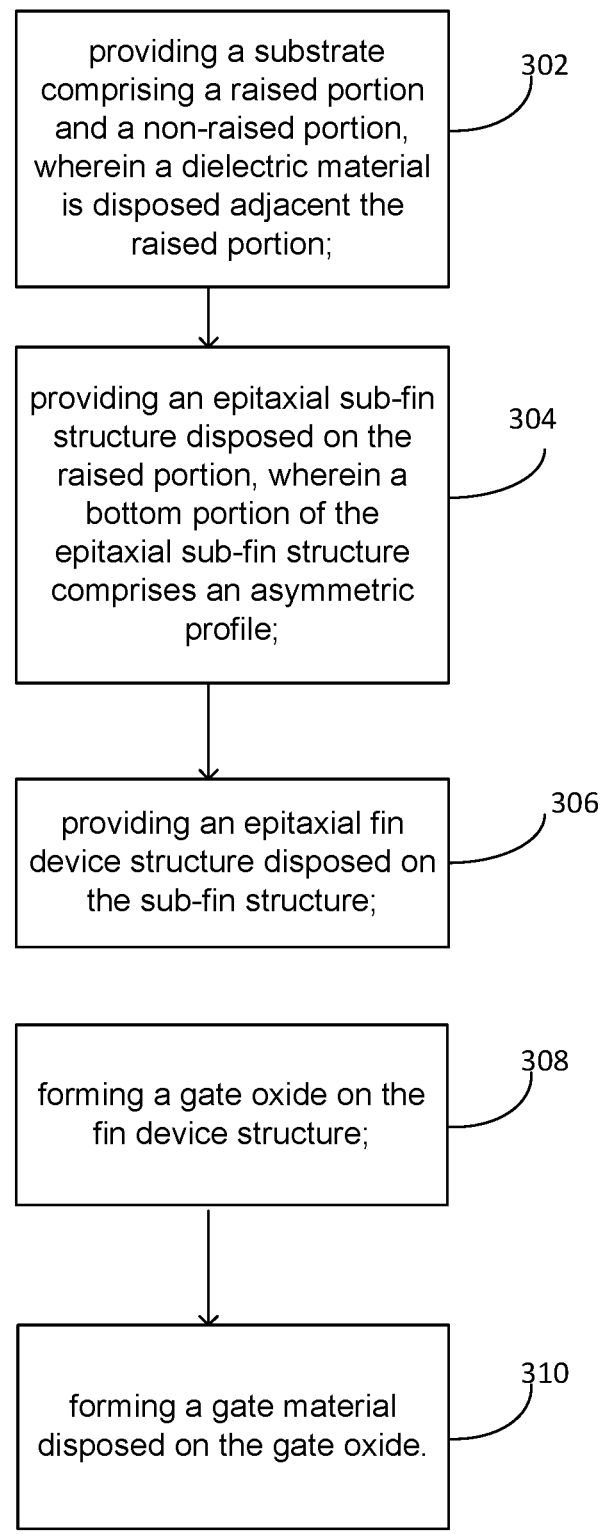
FIG. 3 represents a flow chart of a method according to embodiments.

FIG. 3 depicts a flow chart of a method of forming an epitaxial fin structure on a substrate, according to embodiments. Block 302 includes providing a substrate comprising a raised portion and a non-raised portion, wherein a dielectric material is disposed adjacent the raised portion. Block 304 includes providing an epitaxial sub-fin structure disposed on the raised portion, wherein a bottom portion of the epitaxial sub-fin structure comprises an asymmetric profile. Block 306 includes providing an epitaxial fin device structure disposed on the sub-fin structure. Block 308 includes forming a gate oxide on the fin device structure. Block 310 includes forming a gate material disposed on the gate oxide.

In an embodiment, the fin device structures of the embodiments herein may be coupled with any suitable type of package structures capable of providing electrical communications between a microelectronic device, such as a die and a next-level component to which the package structures may be coupled (e.g., a circuit board). In another embodiment, the devices herein may be coupled with a package structure that may comprise any suitable type of package structures capable of providing electrical communication between a die and an upper integrated circuit (IC) package coupled with the devices herein.

The devices of the embodiments herein may comprise circuitry elements such as logic circuitry for use in a processor die, for example. Metallization layers and insulating material may be included in the devices herein, as well as conductive contacts/bumps that may couple metal layers/interconnects to external devices/layers. The devices described in the various figures herein may comprise portions of a silicon logic die or a memory die, for example, or any type of suitable microelectronic device/die. In some embodiments the devices may further comprise a plurality of dies, which may be stacked upon one another, depending upon the particular application. In some cases the die(s) of the devices herein may be located/attached/embedded on either the front side, back side or on/in some combination of the front and back sides of a package structure. In an embodiment, the die(s) may be partially or fully embedded in a package structure.

The various embodiments of the device structures included herein may be used for SOC products that may require integrated transistor, such as smart phones, notebooks, tablets, and other electronic mobile devices. Fabrication of devices, such as multi-gate transistor devices including fin structures with an asymmetric bottom profile, is described. The epitaxial quality of III-V material is improved by reducing the number of defects emanating from the isolation material sidewalls during epitaxial growth. Enablement of the fabrication of non-silicon CMOS on silicon wafers is realized.

Figure 4:
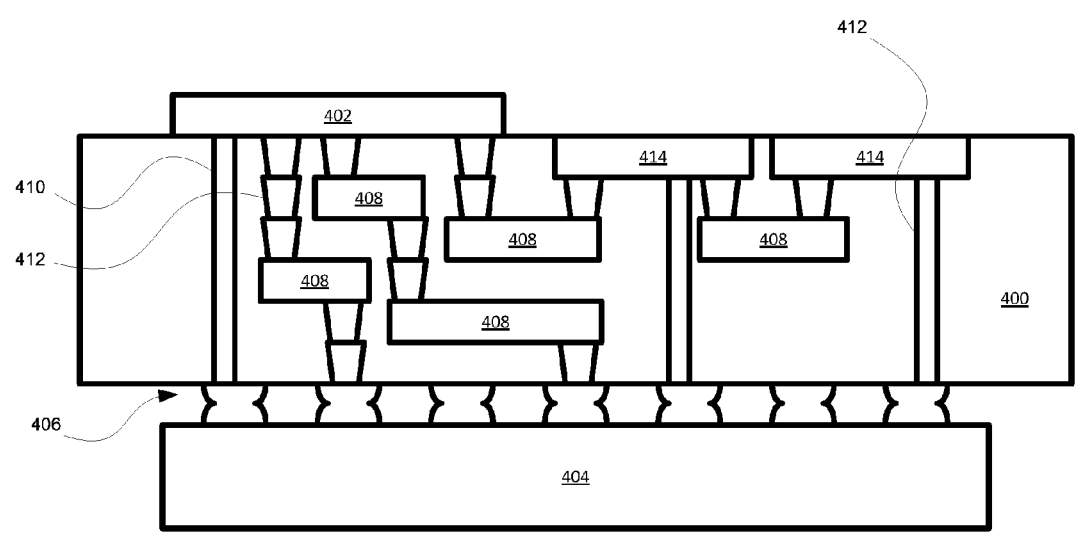
FIG. 4 is an interposer implementing one or more embodiments.

FIG. 4. illustrates an interposer 400 that includes one or more embodiments included herein. The interposer 400 is an intervening substrate used to bridge a first substrate 402 to a second substrate 404. The first substrate 402 may be, for instance, an integrated circuit die, wherein the die may comprise the device structures, such as the fin device structures, of the embodiments herein. The second substrate 404 may be, for instance, a memory module, a computer motherboard, or another integrated circuit die, wherein the second substrate 404 may incorporate the device structures, such as the fin device structures, of the embodiments herein. Generally, the purpose of an interposer 404 is to spread a connection to a wider pitch and/or to reroute a connection to a different connection. For example, an interposer 400 may couple an integrated circuit die to a ball grid array (BGA) 406 that can subsequently be coupled to the second substrate 404. In some embodiments, the first and second substrates 402, 404 are attached to opposing sides of the interposer 400. In other embodiments, the first and second substrates 402, 404 are attached to the same side of the interposer 400. And in further embodiments, three or more substrates are interconnected by way of the interposer 400.

The interposer 400 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 408 and vias 410, including but not limited to through-silicon vias (TSVs) 412. The interposer 400 may further include embedded devices 414, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 400.

Figure 5:
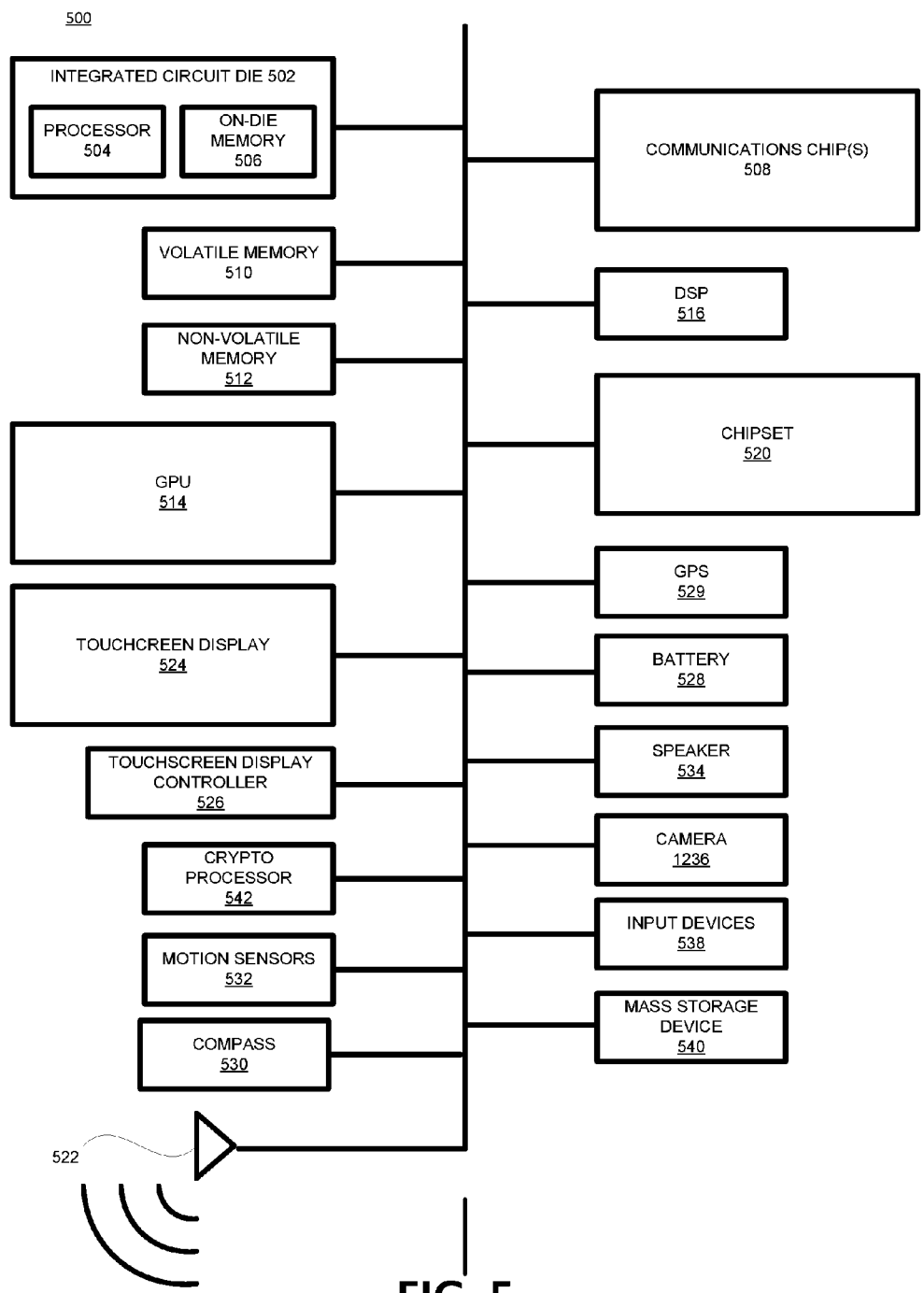
FIG. 5 is a computing device built in accordance with an embodiment.

FIG. 5 illustrates a computing device 500 that may include embodiments of device structures described herein. The computing device 500 may include a number of components. In an embodiment, these components are attached to one or more motherboards. In an alternate embodiment, these components are fabricated onto a single system-on-a-chip (SoC) die rather than a motherboard. The components in the computing device 500 include, but are not limited to, an integrated circuit die 502 and at least one communication chip 508. In some implementations the communication chip 508 is fabricated as part of the integrated circuit die 502. The integrated circuit die 502 may include a CPU 504 as well as on-die memory 506, often used as cache memory, that can be provided by technologies such as embedded DRAM (eDRAM) or spin-transfer torque memory (STTM or STTM-RAM).

Computing device 500 may include other components that may or may not be physically and electrically coupled to the motherboard or fabricated within an SoC die. These other components include, but are not limited to, volatile memory 510 (e.g., DRAM), non-volatile memory 512 (e.g., ROM or flash memory), a graphics processing unit 514 (GPU), a digital signal processor 516, a crypto processor 542 (a specialized processor that executes cryptographic algorithms within hardware), a chipset 520, an antenna 522, a display or a touchscreen display 524, a touchscreen controller 526, a battery 528 or other power source, a power amplifier (not shown), a global positioning system (GPS) device 529, a compass 530, a motion coprocessor or sensors 532 (that may include an accelerometer, a gyroscope, and a compass), a speaker 534, a camera 536, user input devices 538 (such as a keyboard, mouse, stylus, and touchpad), and a mass storage device 540 (such as hard disk drive, compact disk (CD), digital versatile disk (DVD), and so forth).

The communications chip 508 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some s they might not. The communication chip 508 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 508. For instance, a first communication chip 508 may be dedicated to shorter range wireless communications such as Wi-Fi and Bluetooth and a second communication chip 508 may be dedicated to longer range wireless communications such as GPS, EDGE, GPRS, CDMA, WiMAX, LTE, Ev-DO, and others.

The processor 504 of the computing device 500 includes one or more devices, such as transistors or metal interconnects, that are formed in accordance with embodiments herein. The term "processor" may refer to any device or portion of a device that processes electronic data from registers and/or memory to transform that electronic data into other electronic data that may be stored in registers and/or memory.

The communication chip 508 may also include one or more devices, such as transistors device structures and package structures, that are formed in accordance with embodiments herein. In further embodiments, another component housed within the computing device 500 may contain one or more devices, such as transistors device structures and associated package structures, that are formed in accordance with embodiments herein.

In various embodiments, the computing device 500 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

The above description of illustrated embodiments, including what is described in the Abstract, is not intended to be exhaustive or to limit the embodiments to the precise forms disclosed. While specific implementations of, and examples for, the embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the embodiments is to be determined entirely by the following claims, which are to be construed in accordance with established doctrines of claim interpretation.

Although the foregoing description has specified certain steps and materials that may be used in the methods of the embodiments, those skilled in the art will appreciate that many modifications and substitutions may be made. Accordingly, it is intended that all such modifications, alterations, substitutions and additions be considered to fall within the spirit and scope of the embodiments as defined by the appended claims. In addition, the Figures provided herein illustrate only portions of exemplary microelectronic devices and associated package structures that pertain to the practice of the embodiments. Thus the embodiments are not limited to the structures described herein.

The invention claimed is:

1. A microelectronic device structure comprising:
    a substrate comprising a raised portion and a non-raised portion, wherein a dielectric material is disposed adjacent the raised portion, and wherein a top surface of the raised portion comprises a single sided (111) facet of the raised portion material;
    a sub-fin structure disposed on the top surface of the raised portion, wherein a bottom portion of the sub-fin structure comprises an asymmetric profile;
    a fin device structure disposed on the sub-fin structure;
    a gate oxide disposed on a portion of the fin device structure; and
    a gate material disposed on the gate oxide.

2. The structure of claim 1 wherein the sub-fin structure comprises a first side and a second side, wherein the first and second sides are of unequal length.

3. The structure of claim 1 wherein the fin device structure and the sub-fin structure comprise an epitaxial material selected from the group consisting of group III elements, group IV elements, and group V elements.

4. The structure of claim 1 wherein the microelectronic device comprises a device selected from the group consisting of a multi-gate transistor and a gate all around transistor.

5. The structure of claim 1 wherein the bottom portion of the sub-fin structure comprises a (111) silicon plane of the raised portion of the substrate.

6. The structure of claim 1 wherein the single sided (111) facet is disposed along a length of the fin device structure.

7. The structure of claim 1 wherein the raised portion of the substrate comprises an asymmetric profile.

8. The structure of claim 1 wherein the fin device structure extends above a surface of the dielectric material.

9. An electronic system comprising:
    a board;
    a microelectronic device attached to the board, wherein the microelectronic device includes at least one transistor comprising:
        a substrate comprising a raised portion and a non-raised portion, wherein a dielectric material is disposed adjacent the raised portion;
        an epitaxial sub-fin structure disposed on the raised portion, wherein a bottom portion of the epitaxial sub-fin structure comprises an asymmetric profile; and
        an epitaxial fin device structure disposed on the sub-fin structure.

10. The system of claim 9 further comprising wherein the epitaxial material comprises a material selected form the group consisting of gallium nitride, gallium arsenide, indium phosphide, indium aluminum phosphide, indium gallium arsenide, gallium arsenide, indium arsenide and indium gallium nitride.

11. The system of claim 9 further comprising wherein the raised portion of the substrate comprises a first angle and a second angle.

12. The system of claim 9 wherein a portion of the fin device structure comprises a channel region of a transistor structure, and wherein source/drain regions are coupled with the channel region.

13. The system of claim 9 further comprising wherein a top surface of the raised portion comprises a single sided (111) facet of the raised portion material.

14. The system of claim 9 further comprising wherein a ratio of a length of the sub-fin to a width of the sub-fin is greater than about 2:1.

15. The system of claim 9 further comprising wherein the sub-fin comprises a first sidewall comprising a first height, and a second sidewall comprising second height, wherein the first height is longer than the second height.

16. A method of forming a microelectronic device comprising:
    providing a substrate comprising a raised portion and a non-raised portion, wherein a dielectric material is disposed adjacent the raised portion;
    providing an epitaxial sub-fin structure disposed on the raised portion, wherein a bottom portion of the epitaxial sub-fin structure comprises an asymmetric profile;
    providing an epitaxial fin device structure disposed on the sub-fin structure;
    forming a gate oxide on the fin device structure; and
    forming a gate material disposed on the gate oxide.

17. The method of claim 16 further comprising wherein the sub-fin structure comprises a first side and a second side, wherein the first and second sides are of unequal length.

18. The method of claim 16 further comprising wherein a ratio of a length of the sub-fin to a width of the sub-fin is greater than about 2:1.

19. The method of claim 16 further comprising wherein the sub-fin structure and the fin device structure comprise an epitaxial material selected form the group consisting of gallium nitride, indium phosphide, indium aluminum phosphide and indium gallium nitride.

20. The method of claim 16 further comprising wherein a bottom portion of the sub-fin structure is asymmetric, and is disposed on a (111) facet of the raised portion of the substrate.

* * * * *